US006686212B1

(12) United States Patent
Conley, Jr. et al.

(10) Patent No.: US 6,686,212 B1

(45) Date of Patent: Feb. 3, 2004

(54) METHOD TO DEPOSIT A STACKED HIGH-κ GATE DIELECTRIC FOR CMOS APPLICATIONS

(75) Inventors: John F. Conley, Jr., Camas, WA (US); Yoshi Ono, Camas, WA (US); Rajendra Solanki, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/286,100

(22) Filed: Oct. 31, 2002

(51) Int. Cl.[7] .................... H01L 21/00; H01L 21/8242; H01L 29/76; H01L 27/08

(52) U.S. Cl. .......................... 438/3; 438/240; 257/295; 257/310

(58) Field of Search .................... 438/3, 240; 257/295, 257/310

(56) References Cited

U.S. PATENT DOCUMENTS 6,013,553 A * 1/2000 Wallace et al. ............ 438/287
6,203,613 B1 * 3/2001 Gates et al. ................ 117/104
6,297,539 B1 * 10/2001 Ma et al. .................... 257/410
2002/0130340 A1 * 9/2002 Ma et al. .................... 257/295
2002/0153579 A1 * 10/2002 Yamamoto .................. 257/412
2002/0173130 A1 * 11/2002 Pomerede et al. .......... 438/592
2002/0197789 A1 * 12/2002 Buchanan et al. .......... 438/240
2003/0049942 A1 * 3/2003 Haukka et al. ............. 438/778

OTHER PUBLICATIONS

John F. Conley, Jr., et al., *Atomic Layer Deposition of Hafnium Oxide Using Anhydrous Hafnium Nitrate*, Electrochem. and Sol. State Lett. 5 (5) May, 2002.

H. Zhang et al., *High permittivity thin film nanolaminates*, J. Appl. Phys. 87, 1921 (2000).

* cited by examiner

*Primary Examiner*—Matthew Smith
*Assistant Examiner*—Chuong Luu
(74) *Attorney, Agent, or Firm*—David C. Ripma; Matthew D. Rabdau; Scott C. Krieger

(57) ABSTRACT

A method of forming a layer of high-κ dielectric material in an integrated circuit includes preparing a silicon substrate; depositing a first layer of metal oxide using ALD with a metal nitrate precursor; depositing another layer of metal oxide using ALD with a metal chloride precursor; and completing the integrated circuit.

16 Claims, 1 Drawing Sheet

METHOD TO DEPOSIT A STACKED HIGH-κ GATE DIELECTRIC FOR CMOS APPLICATIONS

RELATED APPLICATIONS

This application is related to Ser. No. 09/894,941, filed Jun. 28, 2001, for Method to Initiate the Atomic Layer Deposition of a High Dielelctric Constant Material Directly on a Silicon Substrate.

FIELD OF THE INVENTION

This invention relates to integrated circuit fabrication, and specifically to a method of fabricating a MOS gate dielectric for separating a transistor gate from the channel between the source and drain regions.

BACKGROUND OF THE INVENTION

Thermally grown $SiO_2$ on silicon has been called the "heart and soul" of MOS technology. The $Si/SiO_2$ interface has excellent semiconductor properties including low interface and bulk trapping, thermal stability, high breakdown, etc. With each successive generation of microelectronic technology, however, the thickness of the gate dielectric is scaled. e.g., becomes smaller. As the thickness is scaled below 1.5 nm, problems arise, such as excessive power consumption due to leakage from direct tunneling, boron penetration, reliability concerns, etc. Because of these problems, in the near future, possibly as early as the 80 nm node in 2005, the reign of $SiO_2$ as a gate dielectric may dwindle, eventually coming to an end. $SiO_2$ will likely be replaced by a higher dielectric constant (κ) material, which will have a greater thickness for any given capacitance.

Despite this compelling near term need for an $SiO_2$ substitute, a suitable replacement still has not been discovered. Requirements for this replacement material include lower leakage, low interface traps, low trapped charge, good reliability, good thermal stability, conformal deposition, etc. Promising candidate materials include metal oxides such as $HfO_2$, $ZrO_2$, etc., and other metal oxides.

It is crucial to avoid a low-κ interfacial layer when depositing a high-κ film, as even a very thin low-κ layer can negate most of the benefits of the overlying high-κ material. It is therefore essential to deposit a high-κ material directly on H-terminated silicon layer.

Because of the requirements for conformality and thickness control, atomic layer deposition (ALD) has emerged as one of the most promising deposition techniques for high-κ material. In this technique, dielectric material is built up layer-by-layer in a self-limiting fashion, i.e., the deposition phenominnon where only one monolayer of a chemical species will adsorb onto a given surface. Currently, the leading ALD precursors for depositing metal oxides are metal halides and metal organics. There has also been some experimentation using anhydrous metal nitrates as high-κ dielectric precursors.

A film of $ZrO_2$, deposited using a metal chloride precursor, such as $ZrCl_4$ have shown good insulating properties, including a high-κ dielectric constant and low leakage. A major drawback of $ZrCl_4$, however, is that it does not provide for smooth deposition directly on H-terminated silicon, requires several "incubation" cycles, and requires a thin layer of $SiO_2$ for uniform initiation. These problems must be solved before metal-chloride precursors can be used in production.

A drawback of the metal organic precursors is the potential for organic contamination. $Hf(NO_3)_4$ has been demonstrated as a viable ALD precursor, as identified in the above-identified related Application, and in Conley, Jr., et al., *Atomic Layer Deposition of Hafnium Oxide Using Anhydrous Hafnium Nitrate*, Electrochem. and Sol. State Lett. 5 (5) May, 2002. The primary benefit of $Hf(NO_3)_4$ is that it allows deposition initiation directly on H-terminated silicon, resulting in a uniform thin layer. This method has the potential to avoid a low-κ interfacial layer, however, experimental work has shown that $HfO_2$ films deposited via ALD of $Hf(NO_3)_4$ have a dielectric constant which is lower than expected, possibly because of the oxygen-rich nature of the films. The "bulk" dielectric properties of the resulting films must be improved before metal-nitrate precursors can find widespread use.

SUMMARY OF THE INVENTION

A method of forming a layer of high-κ dielectric material in an integrated circuit includes preparing a silicon substrate; depositing a first layer of metal oxide using ALD with a metal nitrate precursor; depositing another layer of metal oxide using ALD with a metal chloride precursor; and completing the integrated circuit.

It is an object of the invention to deposit a metal oxide high-κ layer on a silicon substrate.

Another object of the invention is to deposit a metal oxide high-κ layer on a silicon substrate without the requirement of forming a low-κ interfacial layer on the silicon substrate.

A further object of the invention is to provide a high-κ layer having low leakage properties.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The state-of-the-art technique for gate formation requires oxidation of silicon at high temperatures. It is likely that $SiO_2$ will be replaced by a metal-oxide, such as $HfO_2$, $ZrO_2$, etc. Although a high-κ deposition method has not been established yet, a leading technique is atomic layer deposition (ALD). ALD is typically performed using a single precursor, such as a metal tetrachloride, metal organic, or anhydrous metal nitrate. As described above, these precursors all have significant disadvantages.

Because the leading precursors currently available for ALD of metal oxides have serious drawbacks, the method of the invention incorporates a combination of precursors to improve the quality of the resulting metal-oxide films. The combination of precursors draws on the advantages of each precursor, while minimizing the disadvantages associated with using the precursors. The method of the invention initiates ALD deposition on H-terminated silicon with a single, or up to five, $Hf(NO_3)_4$ cycles, followed by ALD deposition of the remaining film to desired thickness using another precursor such as $HfCl_4$. The method of the invention eliminates the need for an initial low-κ interfacial layer, while still achieving a "bulk" film with a high dielectric constant.

The method of the invention incorporates the strengths of individual precursors, in combination, to achieve deposition of a high-κ film directly on H-terminated silicon. A $Hf(NO_3)_4$ precursor provides initiation directly on H-terminated silicon and provides a base layer for further ALD using a precursor of $HfCl_4$.

The use of alternate precursors has been previously described, however, use of such alternate precursors has meant using different precursors to interleave different metal oxides, such as $HfO_2$—$ZrO_2$, Ta2O5—$HfO_2$, etc., to create a nano-laminate, as described in H. Zhang, et al., *High Permittivity Thin Film Nanolaminates*, J. Appl. Phys. 87, 1921 (2000). The combination of different precursors to deposit the same metal oxide using multiple deposition cycles is not known to have been reported.

The method of the invention describes a method of gate oxide deposition using ALD. The first, or up to five, ALD deposition cycle(s) use anhydrous hafnium nitrate ($Hf(NO_3)_4$) as the precursor, while the remaining cycles use hafnium tetra-chloride ($HfCl_4$) as the precursor. One ALD deposition cycle includes a pulse of the precursor, either hafnium nitrate or hafnium tetra-chloride, followed by a nitrogen purge, and then a pulse of water vapor, and finally, another nitrogen purge.

Figure 1:
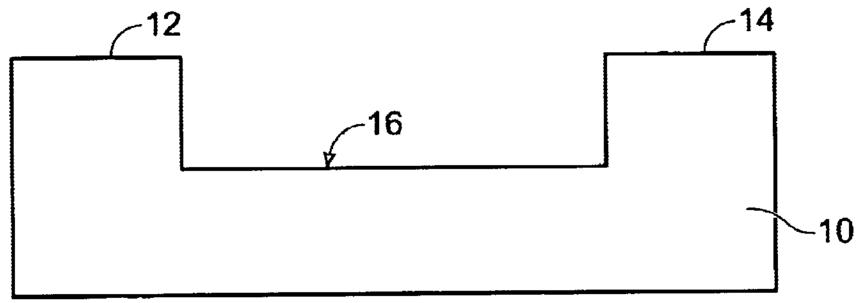
FIG. 1 depicts a silicon substrate having a H-terminated silicon surface.

Referring now to FIG. 1, the structure prior to depositing the gate oxide is formed by any state-of-the-art method, which includes preparing a silicon substrate 10 and field oxide regions 12, 14. The example shown in the figures below is for a replacement gate process. The last step prior to forming the gate oxide is to expose the silicon surface to HF to prepare a H-terminated silicon surface 16.

Figure 2:
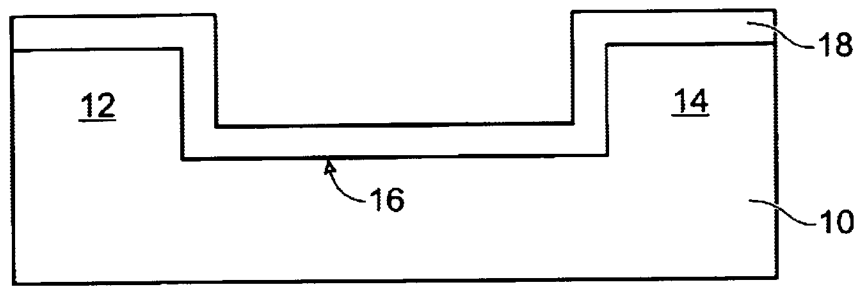
FIG. 2 depicts the substrate after deposition of an initial $HfO_2$ layer.

FIG. 2 depicts the initial, or first layer, 18 of $HfO_2$, which is deposited via ALD using a $Hf(NO_3)_4$ precursor. The purpose of this step is to initiate deposition directly on H-terminated silicon without the need for an "incubation" period or a thin $SiO_2$ layer. The initial layer may be form between about 0.1 nm to 1.5 nm thick.

Figure 3:
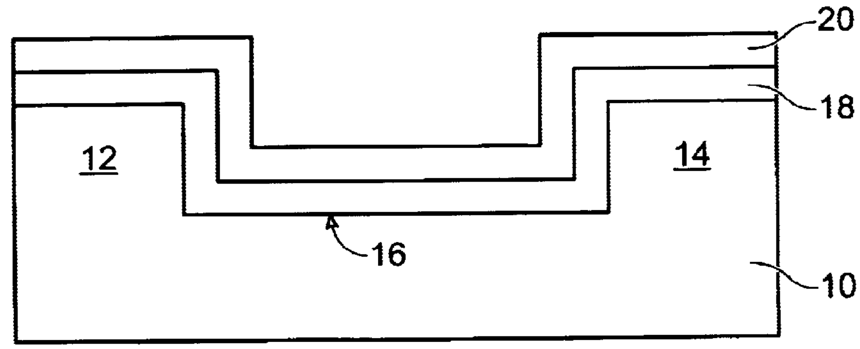
FIG. 3 depicts the structure after deposition of the second, or final, $HfO_2$ layer.

FIG. 3 depicts the another $HfO_2$ "bulk" layer 20 as deposited to a desired thickness, which, in the preferred embodiment, is between about 3 nm to 10 nm thick, using a $HfCl_4$ precursor. This purpose of this step is to create a "bulk" $HfO_2$ film with the expected high dielectric constant.

The fabrication process of the method of the invention then proceeds with the deposition of the gate material, such as a metal gate followed by either and etching process or by CMP. The remaining steps are conventional fabrication processes, well known to those of ordinary skill in the art. The method of the invention eliminates the need for an initial low-κ interfacial layer while still achieving a film with a high dielectric constant.

EXAMPLE $HfO_2$ film A was deposited via a single cycle of ALD using a $Hf(NO_3)_4$ precursor, followed by 40 cycles of ALD using a $HfCl_4$ precursor. As a comparison, a $HfO_2$ film B was deposited without the single cycle ALD nitrate step, using only 40 cycles of $HfCl_4$ precursor-based ALD. Spectroscopic ellipsometry measurements revealed that $HfO_2$ film A, deposited using the initial ALD nitrate cycle, had an average thickness of 8.0 nm and a standard deviation of 0.5 nm. Film B, deposited without the nitrate cycle, had a average thickness of 4.2 nm and a standard deviation of 1.8 nm. The fact that film A is smoother and thicker than film B demonstrates the utility of the method of the invention: initial deposition by a single ALD cycle of $Hf(NO_3)_4$ produces an effective initiation layer for subsequent ALD using $HfCl_4$. The fact that film A is thicker indicates that the "incubation" cycles typical of $HfCl_4$ ALD are not required.

The layer deposited with one, or up to five, ALD cycle(s) using a $Hf(NO_3)_4$ precursor may be used as an initiation layer for ALD using other precursors, such as other metal halides, such as $MI_4$, MBr4, etc., or metallorganics, such as alkoxide, acetylacetonates, t-butoxide, ethoxide, etc. In addition to the $HfO_2$ process described herein, other metal oxides, such as $ZrO_2$, $Gd_2O_3$, $La_2O_3$, $CeO_2$, $TiO_2$, $Y_2O_3$, $Ta_2O_5$, $Al_2O_3$, etc. may also be deposited.

Thus, a method to deposit a stacked high-κ gate dielectric for CMOS applications has been disclosed. It will be appreciated that further variations and modifications thereof may be made within the scope of the invention as defined in the appended claims.

We claim:

1. A method of forming a layer of high-κ dielectric material in an integrated circuit comprising:

preparing a silicon substrate, including forming an H-terminated surface on the silicon substrate;

depositing a first layer of metal oxide using ALD with a metal nitrate precursor;

depositing another layer of metal oxide using ALD with a metal chloride precursor; and completing the integrated circuit.

2. The method of claim 1 wherein said forming includes exposing the silicon surface to HF.

3. The method of claim 1 wherein said depositing a first layer of metal oxide includes depositing a layer of metal oxide using from one to five ALD cycles.

4. The method of claim 1 wherein said depositing another layer of metal oxide includes depositing a layer of metal oxide using multiple ALD cycles to achieve a desired metal oxide layer thickness.

5. The method of claim 1 which includes selecting a metal oxide taken from the group of metal oxides consisting of $HfO_2$, $ZrO_2$, $Gd_2O_3$, $La_2O_3$, $CeO_2$, $TiO_2$, $Y_2O_3$, $Ta_2O_5$ and $Al_2O_3$ to be deposited on the silicon substrate.

6. The method of claim 1 wherein said depositing a first layer of metal oxide includes depositing an initial layer of metal oxide having a thickness of between about 0.1 nm to 1.5 nm.

7. The method of claim 1 wherein said depositing another layer of metal oxide includes depositing a layer of metal oxide having a thickness of between about 3 nm to 10 nm.

8. A method of forming a layer of high-κ dielectric gate oxide in an integrated circuit comprising:

preparing a silicon substrate, including forming an H-terminated surface on the silicon substrate;

depositing a first layer of metal oxide using from one to five ALD cycles with a metal nitrate precursor to achieve a desired metal oxide layer thickness;

depositing another layer of metal oxide using multiple ALD cycles with a metal chloride precursor; and completing the integrated circuit.

9. The method of claim 8 wherein said forming includes exposing the silicon surface to HF.

10. The method of claim 8 which includes selecting a metal oxide taken from the group of metal oxides consisting of $HfO_2$, $ZrO_2$, $Gd_2O_3$, $La_2O_3$, $CeO_2$, $TiO_2$, $Y_2O_3$, $Ta_2O_5$ and $Al_2O_3$ to be deposited on the silicon substrate.

11. The method of claim 8 wherein said depositing a first layer of metal oxide includes depositing an initial layer of metal oxide having a thickness of between about 0.1 nm to 1.5 nm.

12. The method of claim 8 wherein said depositing another layer of metal oxide includes depositing a layer of metal oxide having a thickness of between about 3 nm to 10 nm.

13. A method of forming a layer of $HfO_2$ high-κ dielectric gate oxide in an integrated circuit comprising:

preparing a silicon substrate, including forming an H-terminated surface on the silicon substrate;

depositing a first layer of $HfO_2$ metal oxide using from one to five ALD cycles with a $Hf(NO_3)_4$ precursor to achieve a desired metal oxide layer thickness;

depositing another layer of $HfO_2$ using multiple ALD cycles with a $HfCl_4$ precursor; and completing the integrated circuit.

14. The method of claim 13 wherein said forming includes exposing the silicon surface to HF.

15. The method of claim 13 wherein said depositing a first layer of metal oxide includes depositing an initial layer of metal oxide having a thickness of between about 0.1 nm to 1.5 nm.

16. The method of claim 13 wherein said depositing another layer of metal oxide includes depositing a layer of metal oxide having a thickness of between about 3 nm to 10 nm.

* * * * *